(12) United States Patent
Laskar et al.

(10) Patent No.: US 11,777,011 B2
(45) Date of Patent: Oct. 3, 2023

(54) INTEGRATED CIRCUITRY, METHOD USED IN THE FABRICATION OF A VERTICAL TRANSISTOR, AND METHOD USED IN THE FABRICATION OF INTEGRATED CIRCUITRY

(71) Applicant: Micron Technology, Inc., Boise, ID (US)

(72) Inventors: Masihhur R. Laskar, Boise, ID (US); Jeffery B. Hull, Boise, ID (US); Hung-Wei Liu, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 393 days.

(21) Appl. No.: 17/026,629

(22) Filed: Sep. 21, 2020

(65) Prior Publication Data

US 2022/0093771 A1     Mar. 24, 2022

(51) Int. Cl.
*H01L 29/66* (2006.01)
*H01L 29/78* (2006.01)
*H01L 21/02* (2006.01)
*H10B 51/30* (2023.01)

(52) U.S. Cl.
CPC .. *H01L 29/66553* (2013.01); *H01L 21/02164* (2013.01); *H01L 21/02282* (2013.01); *H01L 21/02345* (2013.01); *H01L 29/6684* (2013.01); *H01L 29/66666* (2013.01); *H01L 29/7827* (2013.01); *H01L 29/78391* (2014.09); *H10B 51/30* (2023.02)

(58) Field of Classification Search
CPC ......... H01L 29/66553; H01L 21/02164; H01L 21/02282; H01L 21/02345; H01L 29/66666; H01L 29/6684; H01L 29/7827; H01L 29/78391; H01L 21/3105; H01L 29/0653; H01L 29/66742; H10B 51/30
See application file for complete search history.

(56) References Cited

U.S. PATENT DOCUMENTS

| | | |
|---|---|---|
| 2015/0104923 A1* | 4/2015 | Tsai ............... H01L 21/02318 438/424 |
| 2015/0348909 A1 | 12/2015 | Yamazaki et al. |
| 2016/0372329 A1 | 12/2016 | Jelinek et al. |
| 2017/0338334 A1* | 11/2017 | Cheng ............. H01L 21/7806 |
| 2019/0221481 A1 | 6/2019 | Schulze et al. |

FOREIGN PATENT DOCUMENTS

KR     101872926     6/2018

OTHER PUBLICATIONS

U.S. Appl. No. 17/027,046, filed Sep. 21, 2020, by Liu et al.

* cited by examiner

*Primary Examiner* — David Vu
(74) *Attorney, Agent, or Firm* — Wells St. John P.S.

(57) ABSTRACT

Integrated circuitry comprises an electronic component. Insulative silicon dioxide is adjacent the electronic component. The insulative silicon dioxide has at least one of (a) and (b), where: (a): an average concentration of elemental-form H of 0.002 to 0.5 atomic percent; and (b): an average concentration of elemental-form N of 0.005 to 0.3 atomic percent. Other embodiments, including method, are disclosed.

20 Claims, 8 Drawing Sheets

INTEGRATED CIRCUITRY, METHOD USED IN THE FABRICATION OF A VERTICAL TRANSISTOR, AND METHOD USED IN THE FABRICATION OF INTEGRATED CIRCUITRY

TECHNICAL FIELD

Embodiments disclosed herein pertain to integrated circuitry, to methods used in the fabrication of a vertical transistor, and to methods used in the fabrication of integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines, gatelines, or gate lines) The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry.

Silicon dioxide is one insulative material that is commonly used in the fabrication of integrated circuitry to provide electrical isolation (insulation) between laterally-adjacent electronic components and as an interlevel dielectric. Silicon dioxide can be formed in a number of different manners, including for example initially using a liquid precursor. Here, a liquid spin-on-dielectric is flowed onto a horizontally-oriented and spinning wafer and advantageously conformally fills all gaps. The wafer is heated sufficiently to cause the liquid to solidify and cause silicon dioxide precursors in the liquid to be transformed into silicon dioxide. The heating is conducted in a furnace that produces a sufficiently high wafer temperature to cause the formation of silicon dioxide. Unfortunately, the high temperature can damage other structures (e.g., circuit components) that are on the wafer. This can preclude spin-on-dielectric from being used in many instances. Accordingly, a need remains for methods that will enable spin-in-dielectrics to be used that don't require high temperature that can damage structures.

DETAILED DESCRIPTION OF EXAMPLE EMBODIMENTS

Embodiments of the invention encompass methods of forming integrated circuitry, for example comprising one or more vertical transistors, and integrated circuitry independent of method of manufacture. Integrated circuitry manufactured in accordance with method embodiments may have any of the attributes as described herein in structure embodiments. Any and all embodiments herein may be encompassed by a memory device (e.g., a memory cell, an array of memory cells, etc.) A first example method embodiment is described with reference to FIGS. 1-6.

Figure 1:
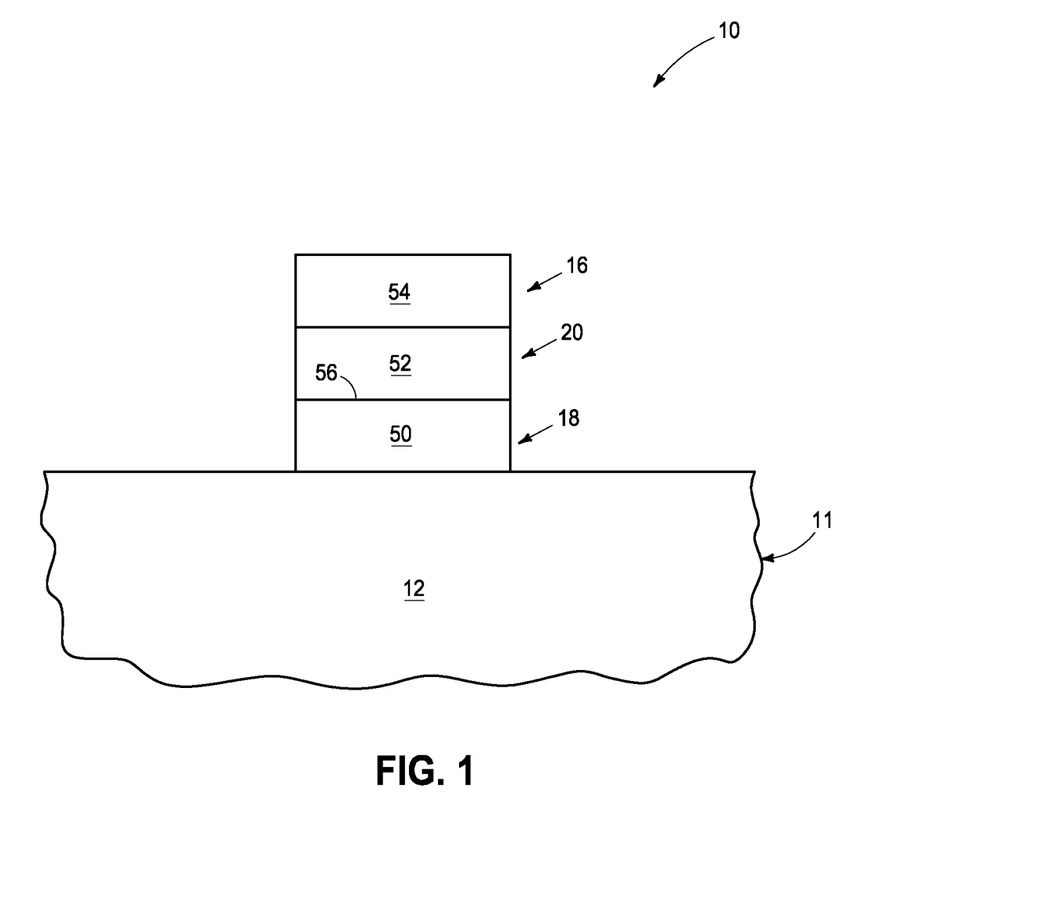
FIG. 1 is a diagrammatic cross-sectional view of a substrate fragment in process in accordance with an embodiment of the invention.

Referring to FIG. 1, a starting construction 10 in the fabrication of a vertical transistor comprises a base substrate 11 having any one or more of conductive/conductor/conducting, semiconductive/semiconductor/semiconducting, or insulative/insulator/insulating (i.e., electrically herein) material(s) 12. Various materials have been formed elevationally over base substrate 11. Materials may be aside, elevationally inward, or elevationally outward of the FIG. 1—depicted materials. For example, other partially or wholly fabricated components of integrated circuitry may be provided somewhere above, about, or within base substrate 11. The discussion initially proceeds in the fabrication of only one vertical transistor, although multiple of the same or different construction vertical transistors may be formed, for example fabricated in an array that includes one or more vertical transistors in accordance with the invention.

A bottom material 50, a top material 54, and a middle material 52 vertically between bottom material 50 and top material 54 have been formed atop base substrate 11. The bottom, top, and middle materials respectively comprise a bottom source/drain region 18, a top source/drain region 16, and a channel region 20 vertically between bottom source/drain region 18 and top source/drain region 16 in a finished construction of the vertical transistor. In one embodiment, bottom material 50 has a substantially planar top 56. The example depicted components for brevity and clarity are only shown in FIG. 1 as a vertical cross-section. The example source/drain regions and channel regions may be, for example, in the form of coextensive longitudinally elongated lines running into and out of the plane of the page upon which FIG. 1 lies. Alternately and by way of example only, such may be circular, rectangular, elliptical, triangular, etc. in horizontal cross-section (not shown). By way of examples only, materials 54, 50, and 52 and therefore regions 16, 18, and 20, respectively, may comprise one or more of appropriately-doped crystalline semiconductor material, such as one or more of silicon, germanium, and so-called III/V semiconductor materials (e.g., GaAs, InP, GaP, and GaN), with source/drain regions 16 and 18 being sufficiently doped to be conductive and channel region 20 being undoped or sufficiently doped to conduct in an "on" state and to not conduct in an "off" state of the transistor. Desired dopant concentrations may be in materials 50, 52, and 54 as-deposited or so provided subsequently. Further, middle material 52 and top material 54 may be provided later in processing than as shown.

Figure 2:
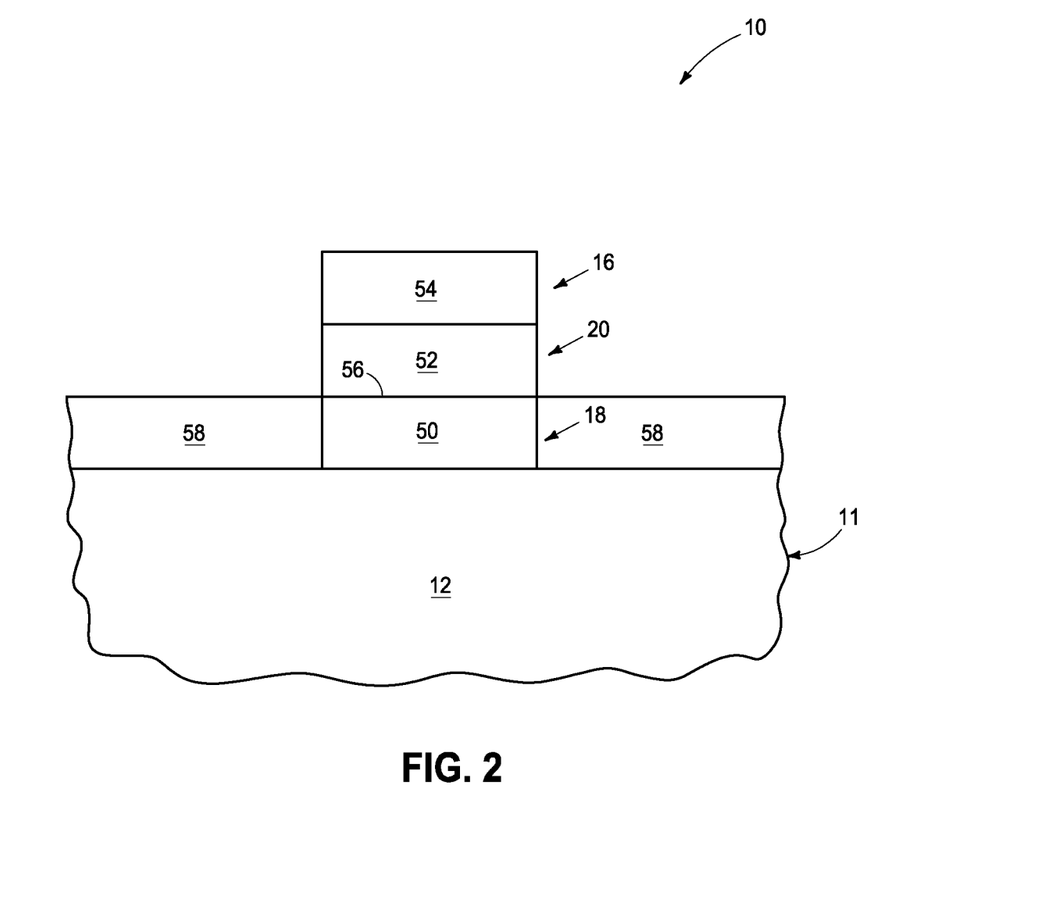
FIGS. 2-6 are diagrammatic sequential sectional views of the construction of FIG. 1 in process in accordance with some embodiments of the invention.

Referring to FIG. 2, a liquid comprising spin-on-dielectric 58 has been flowed onto construction 10 of FIG. 1 to be laterally-aside bottom material 50. Any existing or future-developed spin-on-dielectric may be used.

Figure 3:
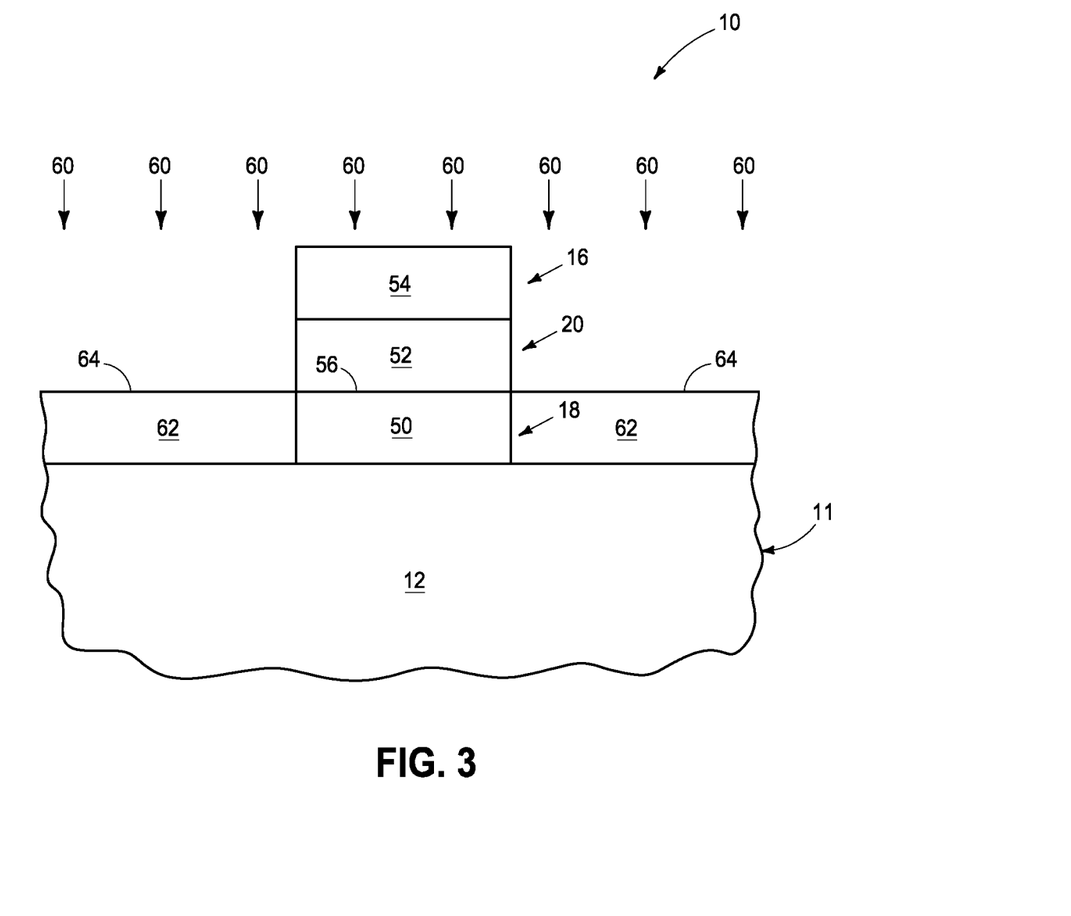

Referring to FIG. 3, spin-on-dielectric 58 (not shown) has been subjected to microwave annealing (diagrammatically indicated by arrows 60) to form insulative silicon dioxide 62 having a substantially planar top 64 that is adjacent substantially planar top 56 of bottom material 50. Insulative silicon dioxide 62 has at least one of (a) and (b), where (a): an average concentration of elemental-form H of 0.002 to 0.5 atomic percent; and (b): an average concentration of elemental-forma N of 0.005 to 0.3 atomic percent.

In one ideal embodiment, planar top 64 of insulative silicon dioxide 62 and planar top 56 of bottom material 50 are each horizontal and are coplanar (as shown). Regardless, during transformation of spin-on-dielectric 58 of FIG. 2 to insulative silicon dioxide 62 of FIG. 3, densification may occur whereby thickness of the initially-formed spin-on-dielectric reduces. Accordingly, initial thickness of spin-on-dielectric 58 may ideally be greater than that shown in FIG. 2 to achieve the construction of FIG. 3. By way of examples only, microwave power during the microwave annealing is 100 watts to 20,000 watts and time of microwave annealing is 10 seconds to 2 hours, with of course lower power taking longer to achieve desired precursor transformation and final silicon dioxide density. The microwave power may be constant or variable during the microwave annealing and may be cyclic in variable power (e.g., including multiple time-spaced microwave annealing steps where microwave power is 0 watts between steps).

In one embodiment, insulative silicon dioxide 62 comprises (a). In one such embodiment, the average concentration of elemental-form H is 0.002 to 0.25 atomic percent, and in one such embodiment is 0.002 to 0.1 atomic percent. In one embodiment, all of insulative silicon dioxide 62 that is laterally-aside bottom material 50 has the concentration of elemental-form H of 0.002 to 0.5 atomic percent.

In one embodiment, insulative silicon dioxide comprises (b). In one such embodiment, the average concentration of elemental-form N is 0.005 to 0.15 atomic percent, and in one such embodiment is 0.005 to 0.0075 atomic percent. In one embodiment, all of insulative silicon dioxide 62 that is laterally-aside bottom material 50 has the concentration of elemental-form N of 0.005 to 0.3 atomic percent. In one ideal embodiment, insulative silicon dioxide 62 that is laterally-aside bottom material 50 comprises (a) and (b).

In one embodiment, conductive material is ultimately formed against substantially planar top 64 of insulative silicon dioxide 62 to form a gate operatively aside middle material 52, One example embodiment of doing so is described with reference to FIGS. 4-6 and another example embodiment with reference to FIG. 7.

Figure 4:
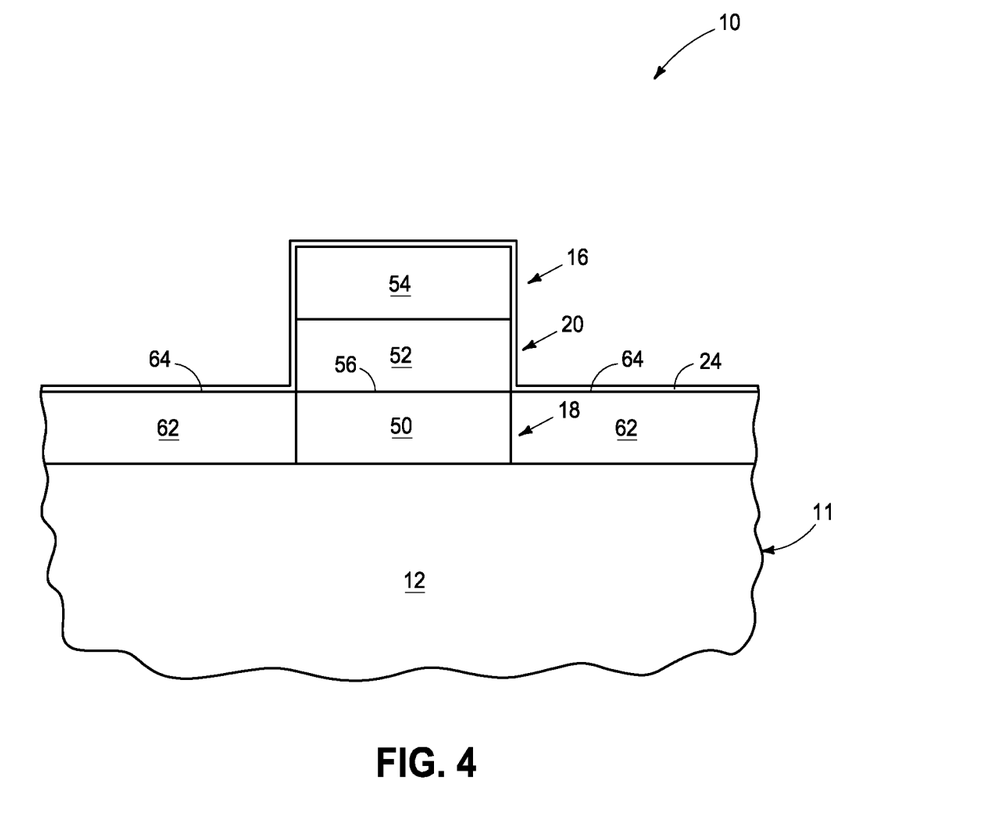

Referring to FIG. 4, a gate insulator 24 (e.g., silicon dioxide, silicon nitride, high-k material, and/or ferroelectric material) has been conformally deposited over the construction of FIG. 3 and thereby at least laterally-over channel region 20. As an alternate example of forming gate insulator 24, sidewalls of middle material 52 may be oxidized or nitridated to form gate insulator 24 (regardless of whether such forms over sidewalls and the uppermost surface of top material 54).

Figure 5:
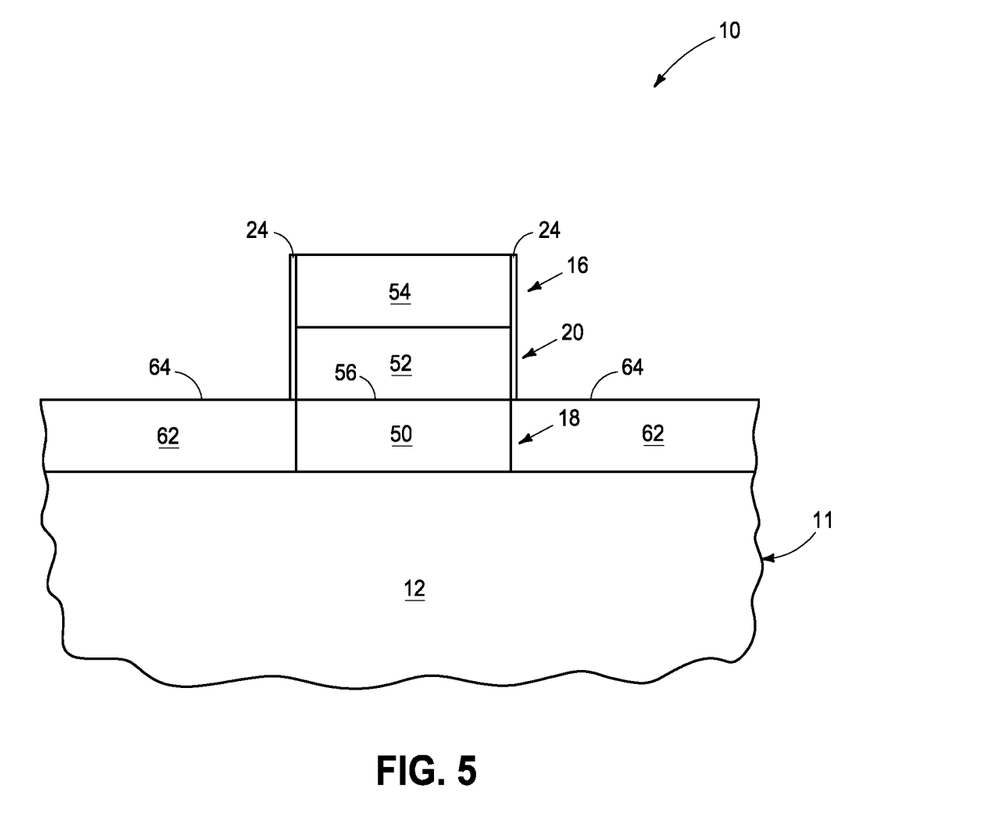

Referring to FIG. 5, and in one embodiment, gate insulator 24 has been substantially removed from being over horizontal surfaces (e.g., by anisotropic spacer-like etching) except where immediately-laterally-adjacent sidewalls of middle material 52 and top material 54. Gate insulator 24 could also be removed to not be over sidewalls of top material 54 (e.g., by continued anisotropic etching, and not shown).

Figure 6:
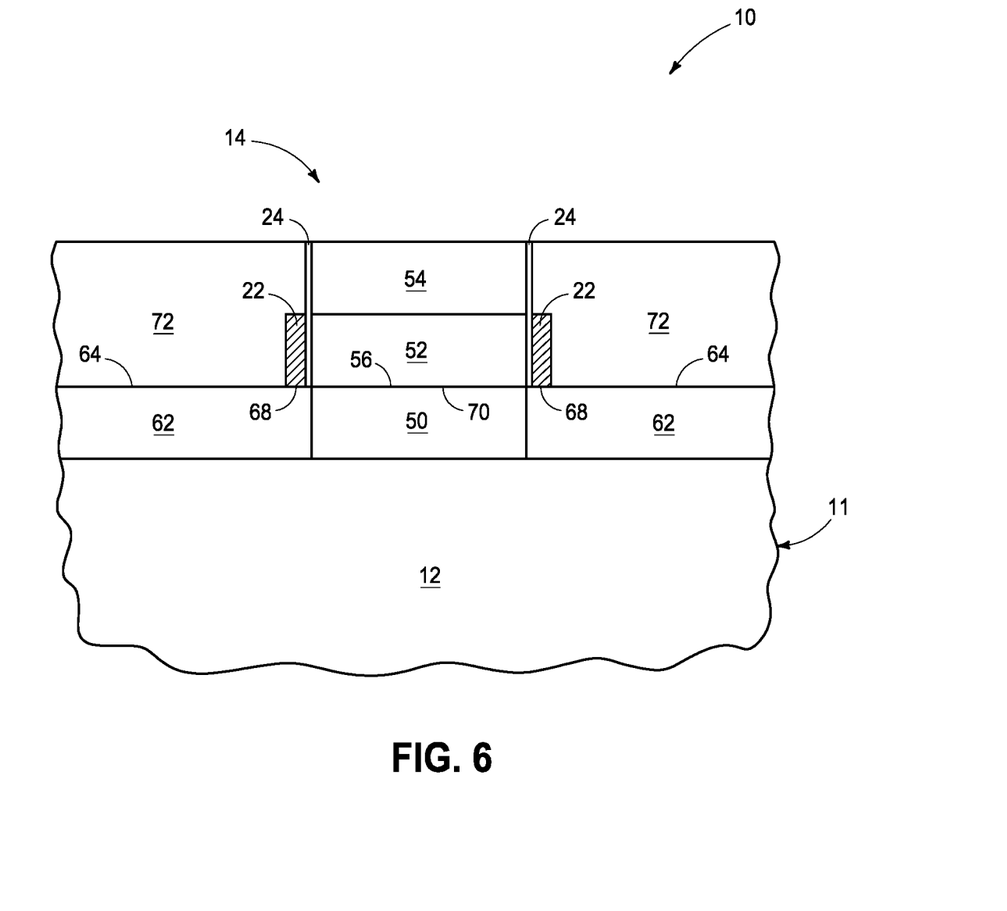

Referring to FIG. 6, a gate 22 (i.e., conductive material) has been formed laterally-adjacent (laterally-aside) channel region 20, with gate insulator 24 being there-between, thus completing construction of a vertical transistor 14. Such may be formed, for example, by depositing the conductive material of gate 22 conformally over the construction of FIG. 5 followed by anisotropic spacer-like etching of such conducting material to produce gate construction 22 as shown. In one embodiment, gate 22 has a substantially planar bottom surface 68 that is adjacent a substantially planar bottom surface 70 of middle material 52. In one such embodiment and as shown, substantially planar bottom surface 68 of gate 22 and substantially planar bottom surface 70 of middle material 52 are each horizontal and are coplanar. Gate insulator 24 and/or gate 22 may peripherally encircle the depicted structure or alternately, by way of example only, be only partially around such structure or only on one lateral-side in vertical cross-section (not shown). Example insulator material 72 has subsequently been formed over vertical transistor 14 and planarized back at least to an uppermost surface of top material 54. Insulator material 72 may be of the same composition as or comprise a different composition from that of insulative silicon dioxide 62 and may be deposited by the same or different manner.

Any other attribute(s) or aspect(s) as shown and/or described herein with respect to other embodiments may be used in the embodiments shown and described with reference to the above embodiments.

Figure 7:
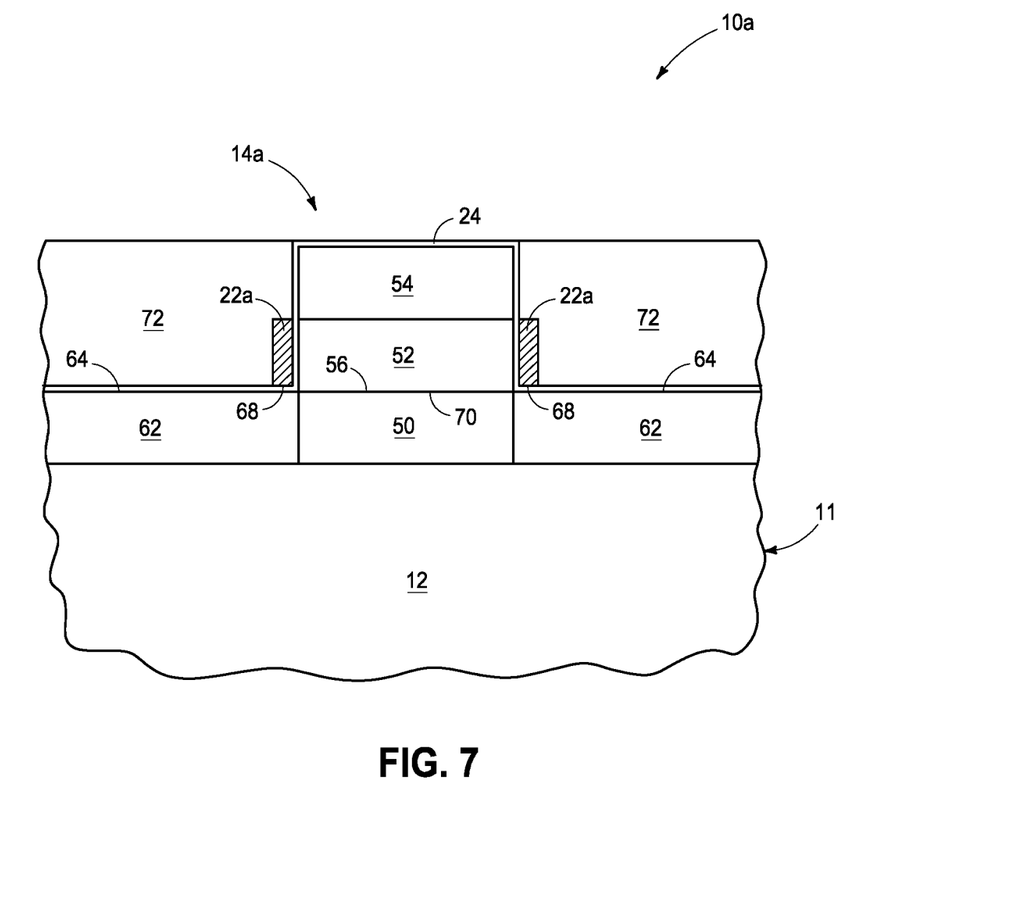
FIG. 7 is a diagrammatic cross-sectional view of a substrate fragment in accordance with an embodiment of the invention.

FIG. 7 shows an alternate embodiment construction 10a. Like numerals from the above-described embodiments have been used where appropriate, with some construction differences being indicated with the suffix "a" or with different numerals. In vertical transistor 14a, gate insulator 24 has not been processed as shown in FIG. 5 prior to depositing the conductive material of gate 22a. Gate 22a has its substantially planar bottom surface 68 adjacent substantially planar bottom surface 70 of middle material 52, but here where planar horizontal bottom surface 68 of gate 22a is higher than planar horizontal bottom surface 70 of middle material 52. Any other attribute(s) or aspect(s) as shown and/or described herein with respect to other embodiments may be used.

Embodiments of the invention include methods used in the fabrication of integrated circuitry independent of whether such includes a vertical transistor or other construction(s) as shown and described with respect to FIGS. 1-7 above. Such comprise flowing a liquid comprising spin-on-dielectric (e.g., 58) onto a substrate (e.g., 11) comprising electronic components (e.g., any existing or future electronic component that may not be completely fabricated at this point of processing, for example all or part of a resistor, capacitor, transistor, diode, etc.). The spin-on-dielectric is microwave annealed (e.g., as indicated by arrows 60 in FIG. 3) to form insulative silicon dioxide (e.g., 62) having at least one of (a) and (b), where:
(a): an average concentration of elemental-form H of 0.002 to 0.5 atomic percent; and
(b): an average concentration of elemental-form N of 0.005 to 0.3 atomic percent.
Any other attribute(s) or aspect(s) as shown and/or described herein with respect to other embodiments may be used.

Method embodiments of the invention may enable use of spin-on-dielectrics that achieve final desired composition and density without heating the substrate as high as furnace annealing does, and thereby reduce risk of damaging previously fabricated components that are on the substrate.

Alternate embodiment constructions may result from method embodiments described above, or otherwise. Regardless, embodiments of the invention encompass integrated circuitry independent of method of manufacture. Nevertheless, such integrated circuitry may have any of the attributes as described herein in method embodiments. Likewise, the above-described method embodiments may incorporate, form, and/or have any of the attributes described with respect to device embodiments.

In one embodiment, integrated circuitry (e.g., a portion of such shown in FIG. 6 and in FIG. 7) comprises a vertical transistor (e.g., 14, 14a) comprising a top source/drain region (e.g., 16), a bottom source/drain region (e.g., 18), a channel region (e.g., 20) vertically between the top and bottom source/drain regions, and a gate (e.g., 22) operatively laterally-aside the channel region. Such integrated circuitry also comprises insulative silicon dioxide (e.g., 62) that is both directly under the gate and laterally-aside the bottom source/drain region. The insulative silicon dioxide has at least one of (a) and (b), where:
(a): an average concentration of elemental-form H of 0.002 to 0.5 atomic percent; and
(b): an average concentration of elemental-form N of 0.005 to 0.3 atomic percent.

In one embodiment, integrated circuitry (regardless of whether comprising a vertical transistor) comprises an electronic component (e.g., 14, 14a). Insulative silicon dioxide (e.g., 62) is adjacent the electronic component. The insulative silicon dioxide has at least one of (a) and (b), where:
(a): an average concentration of elemental-form H of 0.002 to 0.5 atomic percent; and
(b): an average concentration of elemental-form N of 0.005 to 0.3 atomic percent.
Any other attribute(s) or aspect(s) as shown and/or described herein with respect to other embodiments may be used.

Figure 8:
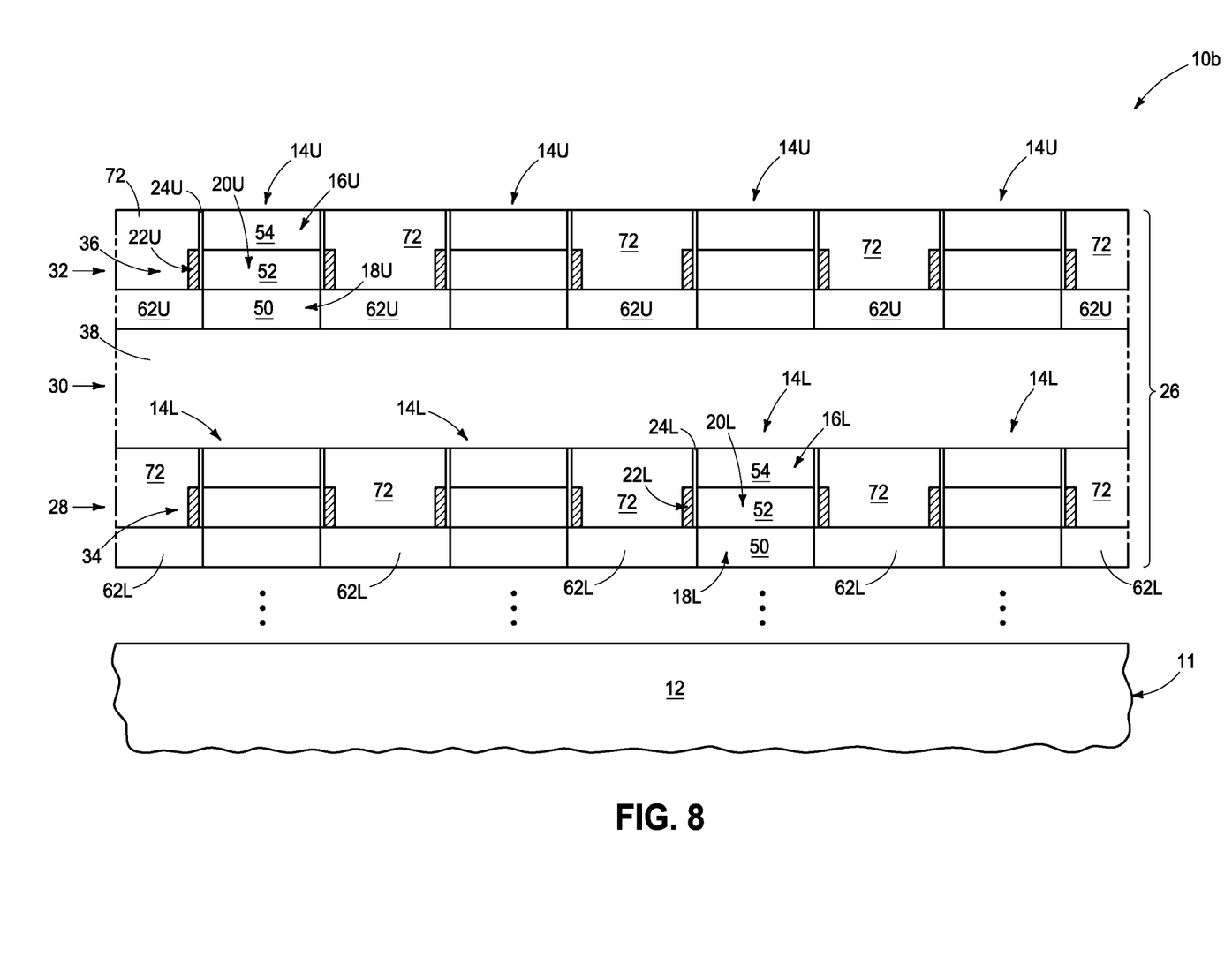
FIG. 8 is a diagrammatic cross-sectional view of a substrate fragment in accordance with an embodiment of the invention.

An additional construction 10b in accordance with an embodiment of the invention is shown in FIG. 8. Like numerals from the above-described embodiments have been used where appropriate, with some differences from construction 10 being indicated with the suffix "b", "L", "U", or with different numerals. Construction 10b comprises an example stack 26 comprising tiers 28, 30, and 32. Construction 10b may have more tiers than shown. The integrated circuitry of construction 10b comprises a lower array 34 comprising vertical transistors 14L. Such transistors individually comprise a lower-array top source/drain region 16L, a lower-array bottom source/drain region 18L, a lower-array channel region 20L vertically between the lower-array top and bottom source/drain regions, and a lower-array gate 22L operatively laterally-adjacent lower-array channel region 20L. Regions 18L, 16L, 20L, and 22L of lower-array vertical transistors 14L may have any of the attributes described above with respect to 18, 16, 20, and 22, respectively. Lower-array insulative silicon dioxide 62L is both directly under lower-array gates 22L and laterally-aside lower-array bottom source/drain regions 18L.

Integrated circuitry of construction 10b comprises an upper array 36 of vertical transistors 14U spaced above lower array 34 of vertical transistors 14L. Upper-array vertical transistors 14U individually comprise an upper-array top source/drain region 16U, an upper-array bottom source/drain region 18U, an upper-array channel region 20U vertically between the upper-array top and bottom source/drain regions, and an upper-array gate 22U operatively laterally adjacent upper-array channel region 20U. Regions 18U, 16U, 20U, and 22U of upper-array vertical transistors 14U may have any of the attributes described above with respect to 18, 16, 20, and 22, respectively. Upper-array insulative silicon dioxide 62U is both directly under upper-array gates 22U and laterally-aside upper-array bottom source/drain regions 18U. Insulating material 38 (e.g., silicon dioxide and/or silicon nitride) is vertically between and spaces lower array 34 and upper array 36 relative one another (e.g., being a tier 30 separating tiers 28 and 32).

At least one of lower-array insulative silicon dioxide 62L and upper-array insulative silicon dioxide 62U has at least one of (a) and (b), where:
(a): an average concentration of elemental-form H of 0.002 to 0.5 atomic percent; and (b): an average concentration of elemental-form N of 0.005 to 0.3 atomic percent.

In one embodiment, lower array 34 comprises at least one of (a) and (b), and in one embodiment comprises both of (a) and (b). In one embodiment, upper array 36 comprises at least one of (a) and (b), and in one embodiment comprises both of (a) and (b). In one embodiment, lower array 34 and upper array 36 each comprise at least one of (a) and (b), and in one embodiment lower array 34 and upper array 36 each comprise both of (a) and (b).

Upper-array silicon dioxide 62U and/or lower-array silicon dioxide 62L may be manufactured in accordance with method embodiments as described herein, or otherwise. Method embodiments herein encompass forming one or both of materials 62L and 62U in a construction 10b as shown.

Any other attribute(s) or aspect(s) as shown and/or described herein with respect to other embodiments may be used.

The above processing(s) or construction(s) may be considered as being relative to an array of components formed as or within a single stack or single deck or within two stacks or two decks of such components above or as part of an underlying base substrate (albeit, the single stack/deck and/or two stacks/decks may each have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive acid/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, integrated circuitry comprises an electronic component. Insulative silicon dioxide is adjacent the electronic component. The insulative silicon dioxide has at least one of (a) and (b), where: (a): an average concentration of elemental-form H of 0.002 to 0.5 atomic percent; and (b): an average concentration of elemental-form N of 0.005 to 0.3 atomic percent.

In some embodiments, a memory device comprising a vertical transistor comprises a top source/drain region, a bottom source/drain region, a channel region vertically between the top and bottom source/drain regions, and a gate operatively laterally-aside the channel region. Insulative silicon dioxide is both directly under the gate and laterally-aside the bottom source/drain region. The insulative silicon dioxide has at least one of (a) and (b), where: (a): an average concentration of elemental-form H of 0.002 to 0.5 atomic percent; and (b): an average concentration of elemental-form N of 0.005 to 0.3 atomic percent.

In some embodiments, integrated circuitry comprises a lower array comprising vertical transistors. The lower-array vertical transistors individually comprise a lower-array top source/drain region, a lower-array bottom source/drain region, a lower-array channel region vertically between the lower-array top and bottom source/drain regions, and a lower-array gate operatively laterally-aside the lower-array channel region. Lower-array insulative silicon dioxide is both directly under the lower-array gates and laterally-aside the lower-array bottom source/drain regions. An upper array of vertical transistors is spaced above the lower array of vertical transistors. The upper-array vertical transistors individually comprise an upper-array top source/drain region, an upper-array bottom source/drain region, an upper-array channel region vertically between the upper-array top and bottom source/drain regions, and an upper-array gate operatively laterally-aside the upper-array channel region. Upper-array insulative silicon dioxide is both directly under the upper-array gates and laterally-aside the upper-array bottom source/drain regions. Insulating material is vertically between and space the lower and upper arrays relative one another. At least one of the lower-array insulative silicon dioxide and the upper-array insulative silicon dioxide have at least one of (a) and (b), where: (a): an average concentration of elemental-form H of 0.002 to 0.5 atomic percent; and (b): an average concentration of elemental-form N of 0.005 to 0.3 atomic percent.

In some embodiments, a method used in the fabrication of integrated circuitry comprises flowing a liquid comprising spin-on-dielectric onto a substrate comprising electronic components. The spin-on-dielectric is microwave annealed to form insulative silicon dioxide having at least one of (a) and (b), where: (a): an average concentration of elemental-form H of 0.002 to 0.5 atomic percent; and (b): an average concentration of elemental-form N of 0.005 to 0.3 atomic percent.

In some embodiments, a method used in the fabrication of a vertical transistor comprises forming a bottom material, a top material, and a middle material vertically between the bottom and top materials. The bottom, top, and middle materials respectively comprise a bottom source/drain region, a top source/drain region, and a channel region vertically between the bottom and top source/drain regions in a finished construction of the vertical transistor. The bottom material has a substantially planar top. A liquid comprising spin-on-dielectric is flowed to be laterally-aside the bottom material. The spin-on-dielectric is microwave annealed to form insulative silicon dioxide that has a substantially planar top that is adjacent the substantially planar top of the bottom material. The insulative silicon dioxide has at least one of (a) and (b), where: (a): an average concentration of elemental-form H of 0.002 to 0.5 atomic percent; and (b): an average concentration of elemental-form N of 0.005 to 0.3 atomic percent. Conductive material is formed against the substantially planar top of the insulative silicon dioxide to form a gate operatively aside the middle material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in the fabrication of a vertical transistor, comprising:
   forming a bottom material, a top material, and a middle material vertically between the bottom and top materials; the bottom, top, and middle materials respectively comprising a bottom source/drain region, a top source/drain region, and a channel region vertically between the bottom and top source/drain regions in a finished construction of the vertical transistor, the bottom material having a substantially planar top;
   flowing a liquid comprising spin-on-dielectric to be laterally-aside the bottom material;
   microwave annealing the spin-on-dielectric to form insulative silicon dioxide having a substantially planar top that is adjacent the substantially planar top of the bottom material, the insulative silicon dioxide having at least one of (a) and (b), where:
      (a): an average concentration of elemental-form H of 0.002 to 0.5 atomic percent; and
      (b): an average concentration of elemental-form N of 0.005 to 0.3 atomic percent;
   forming conductive material against the substantially planar top of the insulative silicon dioxide to form a gate operatively aside the middle material; and
   the substantially planar top of the insulative silicon dioxide and the substantially planar top of the bottom material are each horizontal, the substantially planar top of the insulative silicon dioxide and the substantially planar top of the bottom material being coplanar relative to each other.

2. The method of claim 1 comprising (a).

3. The method of claim 2 wherein the average concentration of elemental-form H is 0.002 to 0.25 atomic percent.

4. The method of claim 3 wherein the average concentration of elemental-form H is 0.002 to 0.1 atomic percent.

5. The method of claim 2 wherein all of the insulative silicon dioxide that is adjacent the electronic component has the concentration of elemental-form H of 0.002 to 0.5 atomic percent.

6. The method of claim 1 comprising (b).

7. The method of claim 6 wherein the average concentration of elemental-form N is 0.005 to 0.15 atomic percent.

8. The method of claim 7 wherein the average concentration of elemental-form N is 0.005 to 0.0075 atomic percent.

9. The method of claim 6 wherein all of the insulative silicon dioxide that is adjacent the electronic component has the concentration of elemental-form N of 0.005 to 0.3 atomic percent.

10. The method of claim 1 comprising (a) and (b).

11. A method used in the fabrication of a vertical transistor, comprising:
    forming a bottom material, a top material, and a middle material vertically between the bottom and top materials; the bottom, top, and middle materials respectively comprising a bottom source/drain region, a top source/drain region, and a channel region vertically between the bottom and top source/drain regions in a finished construction of the vertical transistor, the bottom material having a substantially planar top;
    flowing a liquid comprising spin-on-dielectric to be laterally-aside the bottom material;
    microwave annealing the spin-on-dielectric to form insulative silicon dioxide having a substantially planar top that is adjacent the substantially planar top of the bottom material, the insulative silicon dioxide having at least one of (a) and (b), where:
       (a): an average concentration of elemental-form H of 0.002 to 0.5 atomic percent; and
       (b): an average concentration of elemental-form N of 0.005 to 0.3 atomic percent;
    forming conductive material against the substantially planar top of the insulative silicon dioxide to form a gate operatively aside the middle material; and
    the substantially planar bottom surface of the gate and the substantially planar bottom surface of the middle material are each horizontal, the substantially planar bottom surface of the gate and the substantially planar bottom surface of the middle material being coplanar relative to each other.

12. The method of claim 11 comprising (a).

13. The method of claim 12 wherein the average concentration of elemental-form H is 0.002 to 0.25 atomic percent.

14. The method of claim 13 wherein the average concentration of elemental-form H is 0.002 to 0.1 atomic percent.

15. The method of claim 12 wherein all of the insulative silicon dioxide that is adjacent the electronic component has the concentration of elemental-form H of 0.002 to 0.5 atomic percent.

16. The method of claim 11 comprising (b).

17. The method of claim 16 wherein the average concentration of elemental-form N is 0.005 to 0.15 atomic percent.

18. The method of claim 17 wherein the average concentration of elemental-form N is 0.005 to 0.0075 atomic percent.

19. The method of claim 16 wherein all of the insulative silicon dioxide that is adjacent the electronic component has the concentration of elemental-form N of 0.005 to 0.3 atomic percent.

20. The method of claim 11 comprising (a) and (b).

* * * * *